United States Patent [19]

Hosaka et al.

[11] 4,275,142
[45] Jun. 23, 1981

[54] PHOTOSENSITIVE COMPOSITIONS AND PRINTING PLATES CONTAINING SAME

[75] Inventors: Yoshihiro Hosaka, Yokohama; Yoshiyuki Harita, Kawasaki; Mitsuo Kurokawa, Yokohama; Kunihiro Harada, Machida; Eijiro Tagami, Yokkaichi, all of Japan

[73] Assignee: Japan Synthetic Rubber Co., Ltd., Tokyo, Japan

[21] Appl. No.: 19,878

[22] Filed: Mar. 12, 1979

Related U.S. Application Data

[63] Continuation of Ser. No. 794,101, May 5, 1977, abandoned.

[30] Foreign Application Priority Data

| May 6, 1976 [JP] | Japan | 51/50959 |
| May 6, 1976 [JP] | Japan | 51/50960 |
| Jul. 19, 1976 [JP] | Japan | 51/85186 |
| Feb. 5, 1977 [JP] | Japan | 52/11241 |

[51] Int. Cl.$^3$ .............................................. G03C 1/68
[52] U.S. Cl. .............................. 430/271; 204/159.14; 204/159.22; 204/159.23; 430/286; 430/300
[58] Field of Search .............. 96/35.1, 115 R, 115 P; 204/159.14, 159.22, 159.23; 430/271, 286, 300

[56] References Cited

U.S. PATENT DOCUMENTS

| 3,948,667 | 4/1976 | Ichikawa et al. | 204/159.22 |
| 4,023,973 | 5/1977 | Imaizumio et al. | 430/286 |
| 4,027,063 | 5/1977 | Fujiwara et al. | 204/159.17 |
| 4,045,231 | 8/1977 | Toda et al. | 430/286 |
| 4,162,919 | 7/1979 | Richter et al. | 430/286 |

FOREIGN PATENT DOCUMENTS

569759 1/1959 Belgium .
614181 2/1961 Canada .

OTHER PUBLICATIONS

Encyclopedia of Polymer Science and Technology, vol. 2, 1965, pp. 695–696 and pp. 703–704.
Harita et al., Polymer Engineering and Science, vol. 17, No. 6, Jun. 1977, reprinted as pp. 1–5.

*Primary Examiner*—Jack P. Brammer
*Attorney, Agent, or Firm*—Oblon, Fisher, Spivak, McClelland & Maier

[57] ABSTRACT

A photosensitive resin composition comprising (I) a copolymer containing (A) 10 to 95 mol % of a conjugated diolefinic hydrocarbon, (B) 5 to 90 mol % of an $\alpha,\beta$-ethylenically unsaturated carboxylic acid and (C) 0 to 85 mol % of a monoolefinically unsaturated compound, (II) a photosensitizer and/or a photosensitive crosslinking agent, and, if necessary, (III) a photopolymerizable unsaturated monomer. Said copolymer may have been reacted with an inorganic alkali, an alkali salt or an amine compound in a proportion of 0.05 to 1.0 equivalent per equivalent of the carboxyl group of the $\alpha,\beta$-ethylenically unsaturated carboxylic acid in said copolymer. This photosensitive resin composition is excellent in storage stability, quick in photosetting upon exposure to actinic light rays including ultraviolet rays, that is, high in sensitivity, capable of development with water or a dilute aqueous alkaline solution and possesses satisfactory rubber elasticity, and a printing plate formed from the composition is excellent in water resistance though the composition is developable with an aqueous developing solution, so that the composition can be used for a flexographic printing plate, to which an aqueous flexographic printing ink can be applied. Said composition can also be used for a pohote-resist which is high in sensitivity, developable with water or a dilute alkaline solution and excellent in resolving power.

44 Claims, No Drawings

PHOTOSENSITIVE COMPOSITIONS AND PRINTING PLATES CONTAINING SAME

This is a continuation of application Ser. No. 794,101, filed May 5, 1977, now abandoned.

This invention relates to a photosensitive resin composition which is excellent in storage stability and quick in photo-setting upon exposure to actinic light rays including ultraviolet rays, that is, high in sensitivity, and there is provided a photosensitive resin flexographic printing plate which is low in rubber hardness, that is, high in rubber elasticity, has very excellent water resistance although the composition can be dissolved in an aqueous developing solution and to which an aqueous flexographic printing ink can, hence, be applied, or a photo-resist which has high sensitivity and excellent resolving power and can be developed with an aqueous developing solution, by irradiating the said composition with actinic light to photo-set the exposed area thereof and then dissolving the unexposed area, namely, the unset portion in a dilute alkaline aqueous solution.

A typical trend in the field of printing in recent years has been that typographical printing plates which have been predominantly used as printing plates in the printing industry are being superseded by photosensitive resin relief printing plates under the pressure of various problems such as (1) environmental pollution caused by dispersion of metals such as lead, (2) contamination of the work place where types are manufactured with lead, (3) physical troubles such as lumbago of the workers resulting from lifting or carriage of heavy weights, and (4) difficulty in securing the working hands due to lack of proper working environment. Also, manufacture of the conventional metal-made letterpress printing plates is complicated in its process and requires skilled techniques. The process for manufacturing such printing plates involves many steps including (1) grinding of zinc plates, (2) application of a photosensitizing solution such as PVA-chromate solution, (3) drying, (4) printing of the negative film, (5) development, (6) setting, (7) acid etching, (8) water washing, and (9) finish-drying.

In contrast with this, the manufacture of printing plates from photosensitive resins is simple and not much skill is required, so that any one can obtain resin relief printing plates of uniform quality with ease. The manufacturing process merely comprises the following steps: (1) application of a photosensitive resin composition on a metal plate such as an aluminum or iron plate or a transparent support (in the case of a solid photosensitive resin plate, a photosensitive resin layer has already been applied onto the support), (2) exposure to ultraviolet rays through a negative film, (3) development and (4) finish-drying. This is much simpler than a process for manufacturing a metal relief printing plate. Realization of easy and quick production of negative films by using a computerized photocomposer owing to fast progress of electronics in recent years may also be cited as one of the principal factors that have brought out such development and prevalence of the photosensitive resin relief printing plates. The photosensitive resin relief printing plates have been studied and developed by many research groups in the world, and now such photosensitive resin relief printing plates are being manufactured and sold by more than twenty companies in the world. Rapid progress of the techniques of manufacture of such photosensitive resin relief printing plates in recent years has put on the market various brands of photosensitive resin printing plates which are generally accepted as fulfilling the requirements for such a kind of printing plate and which are considered capable of being substituted for the newspaper-printing sterotypes and metal relief printing plates.

Recently, the field of rubber relief printing, namely so-called flexographic printing has been expanded to, for example, package printing due to a rapid progress of packaging of foods, drinks, package paper and the like; form printing for printing business forms due to computerization thereof; carton printing for printing corrugated boards; and so forth. However, as the conventional flexographic printing systems involve a serious problem that manufacture of the printing plates (rubber relief printing plates) is very complicated in process and requires a great deal of skill, the photosensitive material makers in many countries of the world are making many attempts of producing a photosensitive resin plate that can be substituted for such rubber printing plates. In the process for manufacturing a rubber relief printing plate, the following steps are required after the formation a metal plate mentioned above: (1) a plastic matrix is made by using a thermosetting resin such as phenol resin or the like, (2) a rubber such as natural or synthetic rubber is put into the matrix and pressed under heating to be vulcanized, and (3) the resulting rubber relief printing plate is subjected to makeready to provide a rubber relief printing plate with high accuracy of thickness. Such a makeready treatment must be performed repeatedly if there cannot be obtained a rubber relief printing plate with a satisfactory accuracy of thickness. If the rubber relief printing plate lacks a high accuracy of thickness, no halftone image can be printed with a high reproducibility. Rubber relief printing plates for obtaining high-grade prints are made by hand carving by the skilled artisans, so that it takes several days to make a sheet of a rubber printing plate, and further, the number of such artisans is decreasing in these years. In flexographic printing, contact pressure between the plate cylinder and the impression cylinder is so small as generally referred to as "kiss impression" in the art, and printing is carried out at a high speed under a small printing pressure. Therefore, the flexographic printing plates must have a good ink receptivity, a high-degree flexibility, namely a rubber elasticity, and a high printing endurance.

Rapid progress has been made recently in the field of printing on plastic films or packing papers used for packing or wrapping of foods, clothing articles, medicines and other many sorts of commercial products, and high-grade flexographic printing plates are urgently demanded for various kinds of printing including multicolor printing or even halftone printing. The rubber relief printing plate, which is a kind of sterotype, is suited for printing line drawings, but only a large-mesh screen is used for the halftone printing. Further, as the manufacturing process includes the step of vulcanization under heating, there is a possibility of causing shrinkage of the plate and hence various shrinkage-preventive measures are taken in the process, but there is no gainsaying that such a rubber relief printing plate is not suited for multicolor printing for which a high accuracy of thickness is required. Request for elimination of such defects of the rubber relief printing plates is reckoned as one of the principal factors that urged development of photosensitive resins for flexographic printing. As a flexographic printing plate can be directly made through a negative film formed from a block copy, it is possible to reproduce a halftone printing with a fineness of greater than 150 lines/inch which has been hardly possible with the conventional rubber relief printing plates. Further, as the manufacturing process includes no high-temperature treatment as required in the heat-vulcanization step in the prior art systems, there is no possibility of shrinkage of the plate being caused during the process at all, and thus a flexographic printing plate best suited for multicolor printing can be obtained.

There are commercially available several kinds of photosensitive resin flexographic printing plates, but it cannot be said that these plates meet all performance requirements. Since a photosensitive resin relief printing plate is intended to be made directly from the rubber relief printing plate, a photopolymerizable unsaturated compound and a photosensitizer are added to a synthetic rubber such as styrene-butadiene rubber or acrylonitrile-butadiene rubber, then a photosensitive resin original plate is formed from the mixture and exposed through a negative film to light to give rise to crosslinking between the rubber molecules to form a latent image on said original plate, and the image is developed by utilizing the difference in solubility. However, as rubber is used as the base material, there is mainly used as a developing solution a chlorinated hydrocarbon such as trichlene or perchlene. Therefore, although specific devices are incorporated in the developing apparatus to minimize leak of the organic solvent to the outside, there still exists a possibility of the workers touching directly the organic solvent or inhaling its vapor. Such chlorine type solvents are very injurious to the human body and hence use of such solvents in great volume is subject to the regulations of the Fire Services Act, and these matters are the greatest handicaps of the commercially available photosensitive resin flexographic printing plates. Also, since such plates are made mainly of a rubber with a high molecular weight, the solubility of unexposed area is low at the time of development, and hence the plate surface is manually rubbed with a brush to elevate the dissolving rate. Such an operation, however, may cut out the high-lights in the halftone screen with dense lines or may round the relief shoulders to produce non-sharp prints.

The regulations against air pollution and water contamination are becoming more and more rigorous recently. Such pollution problem is of great concern in the printing industry, too. Owing to use of heat set ink in offset rotary press printing which is rapidly developing with a progress of the modern printing techniques or use of an ink of an alcohol type or a low-boiling aliphatic hydrocarbon solvent type in flexographic printing, serious air pollution is being induced by the solvents which are evaporated in the step of drying through the dryer after printing. In order to prevent this, the printing companies are taking various measures such as (1) burning of the solvent by an after-burner and (2) recovery of the solvent by absorption thereof with activated carbon and by steam distillation. Nevertheless, all of these measures are very expensive and far from perfect solution of the problems.

In an attempt to solve the problem of air pollution by modification of the printing ink, there has been developed a so-called water-base ink. This aqueous ink is being used particularly in flexographic printing and its demand is steadily increasing. Naturally, there is an increasing request for a resin relief printing plate which allows printing, free of trouble, with use of such an aqueous ink. However, the flexographic printing plates currently marketed by the printing companies cannot always meet said request.

One of the properties essentially required for the photosensitive resin compositions to possess is a stability against a storage for a long period of time. The liquid photosensitive resins may undergo gradual chemical change during transport from the production plant to the user, resulting in an increased viscosity to make it hard to remove foams during plate making or degrade the accuracy of plate thickness and developability. Even in the case of solid photosensitive resin original plates, if their storage stability is poor, developability may be deteriorated and reproducibility of the plate may be lost.

As photoresists in metal etching, there are generally used those having chemical resistance to the original reproductions obtained by exposing the image through a proper negative film and dissolving the unexposed area. However, there are available few photosensitive compositions which can meet all of the following general requirements in use as photoresist:

(1) High sensitivity.
(2) High resolving power.
(3) Capability to form uniform coating thickness and non-adhesiveness to the negative film.
(4) High toughness and resistance to chemicals when formed into a set photoresist film.
(5) Sufficient bonding strength to the support.
(6) High storage stability.
(7) No possibility of the photoresist or developing solution becoming a source of pollution.

Heretofore, the compositions prepared by combining a bichromate and a water-soluble high-molecular material such as albumin, gelatin, fish glue or polyvinyl alcohol, or the compositions made of cyclized rubber and a diazide compound have been popularly employed as resist for use in metal etching. However, the former compositions, although excellent in resolving power, are poor in storage stability as they are gradually denatured even placed in a dark place (called as dark reaction) to finally become unusable. They also involve the problem of pollution due to release of chromium. On the other hand, the cyclized rubber type compositions, although free of the problem of dark reaction, are attended by the problem of pollution caused by scatter of the organic solvent into the atmosphere as such an organic solvent is used in the photosensitizing and developing solutions.

Accordingly, an object of this invention is to provide a photosensitive resin composition which is excellent in storage stability, quick in photo-setting and developable with water or a dilute alkaline solution.

Another object of this invention is to provide a photosensitive resin composition which can provide a flexographic printing plate having excellent rubber elasticity and water resistance and allowing use of an aqueous flexographic printing ink in printing operations with such printing plate.

Still another object of this invention is to provide a photosensitive resin composition free of the above-said disadvantages of the conventional compositions.

Other objects and advantages of the present invention will become apparent from a consideration of the following detailed description of the invention.

According to the present invention, there is provided a photosensitive resin composition comprising (I) a copolymer consisting of (A) 10 to 95 mol % of a conjugated diolefinic hydrocarbon, (B) 5 to 90 mol % of an α,β-ethylenically unsaturated carboxylic acid or anhydride and (C) 0 to 85 mol % of a monoolefinically unsaturated compound, (II) a photosensitizer and/or a photosensitive crosslinking agent, and, if necessary, (III) a photopolymerizable unsaturated monomer. Said copolymer may have been reacted with an inorganic alkali, alkali salt or amine compound at a proportion of 0.05 to 1.0 equivalent per equivalent of the carboxyl group of the α,β-ethylenically unsaturated carboxylic acid or anhydride in said copolymer. These compositions are excellent in storage stability and quickly photoset upon irradiation of the actinic light rays including ultraviolet rays, that is, high in sensitivity, and they can provide a photosensitive resin flexographic printing plate having low rubber hardness and hence good rubber elasticity, very excellent water resistance although dissolvable in an aqueous developing solution and high resolving power and also allowing use of an aqueous ink in flexographic printing with such plate, or a photoresist with excellent resolving power. Such plate or photoresist can be obtained by merely irradiating said composition with the actinic light rays to effect photosetting and then dissolving the unexposed area, that is, unset area, in water or a dilute alkaline solution.

Preferred examples of the conjugated diolefinic hydrocarbons in the copolymer used in this invention are those represented by the formula,

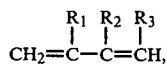

wherein $R_1$ is hydrogen, methyl, ethyl, n-propyl or isopropyl, phenyl, chlorine, bromine or iodine, $R_2$ is hydrogen, methyl or chlorine, and $R_3$ is hydrogen or methyl, and particularly preferably are 1,3-butadiene, isoprene, chloroprene, dimethylbutadiene and the like. These conjugated diolefinic hydrocarbons may be used either singly or in admixture of two or more, provided that the total amount of such hydrocarbons is within the range of 10 to 95 mol %. It is, however, most preferable that the conjugated diolefinic hydrocarbon content is within the range of 30 to 70 mol %. When such conjugated diolefinic hydrocarbon(s) is polymerized to enter the copolymer, the photopolymerizable unsaturated monomer radicals (to be described later) are attached to the double bonds remaining in the main or side chains of the copolymer by the photo-reaction, and after the photo-reaction, the composition not only forms a solid three-dimensional reticulate structure but also enhances water and organic solvent resistance. Also, the conjugated diolefinic hydrocarbon contained in the copolymer provides flexibility, that is, rubber elasticity, which is an essential requirement for a flexographic printing plate.

If the content of said conjugated diolefinic hydrocarbon in the copolymer is less than 10 mol %, the said three-dimensional crosslinking characteristic and elasticity required for a flexographic printing plate are not provided to make it impossible to obtain a desired resin relief printing plate. On the other hand, if said content exceeds 95 mol %, the content of the α,β-ethylenically unsaturated carboxylic acid in the copolymer is correspondingly decreased, resulting in reduced affinity to the dilute alkaline solution of the photosensitive resin layer containing said copolymer as a principal ingredient, making it impossible to employ the desired developing method.

The α,β-ethylenically unsaturated carboxylic acid or anhydride used as another essential ingredient in the composition of this invention may be, for example, a monocarboxylic acid represented by the formula,

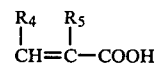

wherein $R_4$ is hydrogen or methyl and $R_5$ is hydrogen, methyl, ethyl, or chlorine, such as acrylic acid, methacrylic acid or crotonic acid; a dicarboxylic acid having 4 to 5 carbon atoms such as maleic acid, fumaric acid, itaconic acid, citraconic acid, or mesaconic acid, an anhydride thereof such as maleic acid anhydride, citraconic acid anhydride or itaconic acid anhydride, or a dicarboxylic acid monoester such as monomethyl maleate, monoethyl maleate, mono-n-propyl maleate, mono-n-butyl maleate, monomethyl fumarate, monoethyl fumarate, mono-n-propyl fumarate, mono-n-butyl fumarate, monomethyl itaconate, monoethyl itaconate, mono-n-propyl itaconate, or mono-n-butyl itaconate. Said α,β-ethylenically unsaturated carboxylic acid or anhydride should be contained in an amount of 5 to 90 mol %, preferably 10 to 60 mol %, in the copolymer. If the content of said carboxylic acid or anhydride is less than 5 mol %, the proportion of the hydrophilic groups in the copolymer is so decreased as to make it impossible to practice the developing system intended in this invention. The copolymer containing more than 90 mol % of α,β-ethylenically unsaturated carboxylic acid is so low in rubber elasticity that no desired water resistance is provided to the printing plate obtained from the photosensitive resin layer containing such a copolymer through the steps of exposure and development. These α,β-ethylenically unsaturated carboxylic acids or anhydrides may be used singly or in admixture of two or more if the total content is within the range of 5 to 90 mol %.

It was found that if as the α,β-ethylenically unsaturated carboxylic acid or anhydride (B) there is used an α,β-ethylenically unsaturated dicarboxylic acid or anhydride, that is, if a photosensitive resin composition is prepared from a copolymer comprising an α,β-ethylenically unsaturated dicarboxylic acid or anhydride or an alkali or amine salt thereof, such a composition proves to be quick in photo-setting upon irradiation with actinic light rays including ultraviolet rays, that is extremely high in sensitivity, and it can provide a flexographic printing plate with a very excellent retainability of independent fine lines or dots. It was also found that such a composition can form a photoresist with an extremely high sensitivity and acid resistance.

The high sensitivity of the composition in manufacture of the photoresist leads to various advantages, such as reduced process time, perfect attainment of photo-setting in a short time and increased strength of the resist film. Also, even if the step of baking the pattern which is indispensable in the conventional methods, is omitted, there does not take place strip-off of the resist during the etching step and extremely high dimensional stability is maintained.

The monoolefinically unsaturated compound (C) is not an essential component in the composition of this invention, but blending of such a compound can further improve not only the rubber elasticity of the flexographic printing plate, which is the primary object of this invention, and the mechanical strength of such a plate but also the printability thereof such as ink solvent resistance and ink transferability.

The monoolefinically unsaturated compounds usable in this invention include styrene, α-methylstyrene, o-methylstyrene, m-methylstyrene, p-methylstyrene, p-methoxystyrene, acrylonitrile, methacrylonitrile, vinyl chloride, vinylidene chloride, acrylamide, methacrylamide, vinyl acetate, and acrylic or methacrylic esters represented by the following general formula:

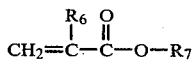

where $R_6$ is hydrogen or a methyl group, and $R_7$ is an alkyl group having 1 to 18 carbon atoms, such as methyl acrylate or methacrylate, ethyl acrylate or methacrylate, propyl acrylate or methacrylate, n-butyl acrylate or methacrylate, isobutyl acrylate or methacrylate, tert-butyl acrylate or methacrylate, n-pentyl acrylate or methacrylate, n-hexyl acrylate or methacrylate, 2-ethylhexyl acrylate or methacrylate, n-octyl acrylate or methacrylate, n-decyl acrylate or methacrylate, lauryl acrylate or methacrylate, n-octadecyl acrylate or methacrylate, and the like. It is also possible to use effectively diesters of dicarboxylic acid such as dimethyl maleate, diethyl maleate, dibutyl maleate, dioctyl maleate, dimethyl fumarate, dibutyl fumarate, dioctyl fumarate, dimethyl itaconate, diethyl itaconate, dibutyl itaconate and diethyl itaconate, acrylates or methacrylates having a cyclic side chain such as benzyl acrylate or methacrylate, cyclohexyl acrylate or methacrylate, tetrahydrofurfuryl acrylate or methacrylate, and glycidyl acrylate or methacrylate, alkoxyalkyl acrylates or methacrylates or alkoxypolyalkyleneglycol acrylates or methacrylates represented by the following general formula:

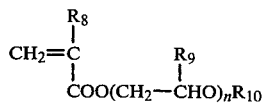

where $R_8$ and $R_9$ represent hydrogen or a methyl group, $R_{10}$ represents an alkyl group with 1 to 12 carbon atoms and n represents an integer of 1 to 23, such as methoxyethyl acrylate or methacrylate, ethoxyethyl acrylate or methacrylate, propoxyethyl acrylate or methacrylate, butoxyethyl acrylate or methacrylate, methoxy-i-propyl acrylate or methacrylate, ethoxy-i-propyl acrylate or methacrylate, propoxy-i-propylacrylate or methacrylate, butoxy-i-propyl acrylate or methacrylate, methoxydiethyleneglycol acrylate or methacrylate, ethoxydiethyleneglycol acrylate or methacrylate, propoxydiethyleneglycol acrylate or methacryl, butoxydiethyleneglycol acrylate or methacrylate, methoxydipropyleneglycol acrylate or methacryl, ethoxydipropyleneglycol acrylate or methacrylate, propoxydipropyleneglycol acrylate or methacrylate, butoxydipropyleneglycol acrylate or methacrylate, methoxytetraethyleneglycol acrylate or methacrylate, methoxynonaethyleneglycol acrylate or methacrylate, methoxytetrapropyleneglycol acrylate or methacrylate, or methoxynonapropyleneglycol acrylate or methacrylate, and esters of hydroxalkyl alcohol such as 2-hydroxyethyl acrylate or methacrylate and 2-hydroxylpropyl acrylate or methacrylate. These compounds may be used in combination of two or more, provided that the total content of such compounds does not exceed 85 mol%. Usually, it is preferred to use such monoolefinically unsaturated compound or compounds in an amount of less than 60 mol %.

If a copolymer containing more than 85 mol % of said monoolefinically unsaturated compound(s) is used in the photosensitive resin composition of this invention, as the contents of the conjugated diolefinic hydrocarbon and α,β-ethylenically unsaturated dicarboxylic acid in said copolymer are correspondingly decreased, there results not only deterioration of flexibility and rubber elasticity of the product, which are indebted to th conjugated diolefinic hydrocarbon, but also lowering of sensitivity which is provided from copolymerization of the α,β-ethylenically unsaturated dicarboxylic acid.

An ordinary radical polymerization method may be employed for synthesizing a copolymer usable in this invention comprising a conjugated diolefinic hydrocarbon, an α,β-ethylenically unsaturated carboxylic acid and a monoolefinically unsaturated compound. In said radical polymerization method, an alcohol such as methanol, ethanol or n-propanol, a cyclic ether such as tetrahydrofuran or dioxane, a ketone such as acetone or methyl ethyl ketone, or an amide such as dimethylformamide may be suitably used as solvent. As radical polymerization initiator, there may be favorably used the following: a hydroperoxide such as propyl hydroperoxide or cumene hydroperoxide, a dialkyl peroxide such as di-tert-butyl peroxide or di-α-cumyl peroxide, a peracid and its ester such as perbenzoic acid or tert-butyl perbenzoate, a diacyl such as acetyl peroxide or benzoyl peroxide, an azo compound such as 2,2′-azobisisobutyronitrile or 2,2′-azobis-2-methylbutyronitrile and hydrogen peroxide. It is also possible to use a polymerization regulator such as n-dodecylmercaptan or tert-dodecylmercaptan as in ordinary radical polymerization. The radical polymerization initiator is preferably used in a proportion within the range of 0.1 to 10 weight %, and the polymerization regulator in a proportion within the range of 0 to 10 weight %. If the content of the radical polymerization initiator is less than 0.1 weight %, the polymerization reaction does not proceed satisfactorily and there remains a large amount of unreacted product, so that the resulting photosensitive resin composition is intolerably low in sensitivity and cannot provide a printing plate with a sufficient rubber elasticity. It is not economical to use said initiator in excess of 10 weight %. In this case, the polymerization rate is too much elevated to invite vehement heat generation, making it hard to control polymerization. The radical polymerization initiator may be added in its entire amount at one time or may be added portionwise, provided that the total amount added stays within the range of 0.1 to 10 weight %. Use of the polymerization regulator is not an essential requirement. It is recommended to use such regulator in case an insoluble portion is produced in the mixture of the conjugated diolefinic hydrocarbon, α,β-ethylenically unsaturated carboxylic acid or anhydride and monoolefinically unsaturated compound during polymerization, or in case the polymerization rate elevates excessively to cause an excessive increase of molecular weight of the obtained copolymer to make it hard to obtain a desired photosensitive resin composition or to worsen developability of such composition. The number-average molecular weight of the copolymer used in this invention should be within the range of from 1,000 to 200,000, preferably from 5,000 to 100,000. In case the number-average molecular weight is less than 1,000, the resultant photosensitive resin composition is necessarily in liquid state and the composition proves to be too low in viscosity, resulting in a poor accuracy of plate thickness and an increased rate of contraction after photo-setting to give rise to various disadvantages such as poor duplicability. Also, such composition is hard to make into a printing plate and the obtained plate proves to be weak in mechanical strength and unable to stand practical use for printing. On the other hand, use of a copolymer with a number-average molecular weight of more than 200,000, although proving helpful to better sensitivity and rubber elasticity, results in too low a solubility in the dilute alkaline solution to practice the developing method intended in this invention. Thus, it was found that, in case of synthesizing a copolymer containing said conjugated diolefinic hydrocarbon according to a usual radical solution polymerization method, the number-average molecular weight of the copolymer should be within the range of from 1,000 to 200,000, and that in case of using a copolymer with a number-average molecular weight outside the above-said range, it needs to adopt some specific measures such as performing telomerization by using the polymerization regulator as solvent, or conducting the polymerization at a low temperature and for a prolonged period of time by combining a reducing agent while decreasing the content of the radical polymerization initiator.

The inorganic alkali used in this invention is preferably lithium hydroxide, sodium hydroxide, potassium hydroxide or ammonia. The alkali salt may be lithium carbonate, sodium carbonate, potassium carbonate, ammonium carbonate or the like. It is also favorable to use an amine compound for the purpose of this invention, and such amine compound may be, for example, a primary amine such as ethylamine or n-propylamine, a secondary amine such as diethylamine or di-n-propylamine, a tertiary amine such as triethylamine or methyldiethylamine, an alcohol amine such as dimethylethanolamine or triethanolamine, or a cyclic amine such as morpholine. Such compound is used at a proportion of 0.05 to 1.0 equivalent, preferably 0.2 to 1.0 equivalent, per equivalent of the carboxyl groups of the $\alpha,\beta$-ethylenically unsaturated carboxylic acid or anhydride contained in said copolymer (I). It is also possible to use a mixture of two or more of said alkalis, provided that the total content of such alkali mixture is within said range. Thus, if at least a part of the $\alpha,\beta$-ethylenic unsaturated carboxylic acid or anhydride contained in the copolymer (I) is substituted by an alkali metal salt, ammonium salt or amine salt, it becomes possible to use water as the developing solution when dissolving the unexposed area after photo-setting. However, if the content of these substances is less than 0.05 equivalent, the copolymer itself becomes insoluble in water, so that it becomes impossible to use water as the developing solution.

The photosensitizer used in this invention may be, for example, an $\alpha$-diketone compound such as diacetyl or benzil, an acyloin such as benzoin or pivaloin, an acyloin ether such as benzoin methyl ether, benzoin ethyl ether, or benzoin isopropyl ether, a polynuclear quinone such as anthraquinone or 1,4-naphthoquinone, a peroxide such as benzoyl peroxide or methyl ethyl ketone peroxide, and an azo compound such as 2,2'-azobisisobutyronitrile. Preferred examples of the photosensitive crosslinking agent also used in this invention are diazides such as diazidochalcone, 4,4'-diazidostilbene, 4,4'-diazidostilbene-2,2'-disulfonic acid or 2,6-bis-(p-azidobenzal)-cyclohexanone. The contents of these photosensitizer and photosensitive crosslinking agent should be within the range of 0.1 to 10 weight %, preferably 1 to 5 weight %, based on the copolymer (I). If such contents are less than 0.1 weight %, there takes place no satisfactory photo-setting in the photosensitive resin layer, while the contents of over 10 weight % result in poor economy as the entirety of these agents added does not necessarily participate in the reaction, and in some cases, such excess contents could deteriorate compatibility of the mixed materials to cause non-uniform dispersion.

As examples of the photopolymerizable unsaturated monomers usable in this invention, one may cite the following: unsaturated aromatic compounds such as styrene, $\alpha$-methylstyrene, o-methylstyrene, m-methylstyrene, p-methylstyrene, p-methoxystyrene, diisopropenylbenzene and divinylbenzene; unsaturated nitrile compounds such as acrylonitrile and methacrylonitrile; acrylates or methacrylates of alkyl alcohol such as methyl acrylate or methacrylate, ethyl acrylate or methacrylate, propyl acrylate or methacrylate, n-butyl acrylate or methacrylate, isobutyl acrylate or methacrylate, tert-butyl acrylate or methacrylate, n-pentyl acrylate or methacrylate, n-hexyl acrylate or methacrylate, 2-ethylhexyl acrylate or methacrylate, n-octyl acrylate or methacrylate, n-decyl acrylate or methacrylate, lauryl acrylate or methacrylate and n-octadecyl acrylate or methacrylate; acrylates or methacrylates of hydroxyalkyl alcohol such as 2-hydroxyethyl acrylate or methacrylate and 2-hydroxypropyl acrylate or methacrylate; acrylates or methacrylates having a cyclic side chain such as benzyl acrylate or methacrylate, cyclohexyl acrylate or methacrylate and tetrahydrofurfuryl acrylate or methacrylate; $\alpha,\beta$-ethylenically unsaturated carboxylic acids such as maleic acid, fumaric acid, maleic anhydride, acrylic acid, methacrylic acid, itaconic acid and itaconic anhydride; monoesters of unsaturated polycarboxylic acids such as a monoester of maleic, fumaric or itaconic acid; diesters of unsaturated polycarboxylic acids such as dimethyl maleate, diethyl maleate, dibutyl maleate, dioctyl maleate, dimethyl fumarate, diethyl fumarate, dibutyl fumarate, dioctyl fumarate, dimethyl itaconate, diethyl itaconate, dibutyl itaconate and dioctyl itaconate; acrylamides or methacrylamides such as acrylamide, methacrylamide, N,N'-methylenebisacrylamide and N,N'-hexamethylenebisacrylamide; diacrylates or dimethacrylates of polyalkylene glycol (2 to 23 alkyleneglycol units) such as ethyleneglycol diacrylate or dimethacrylate; diacrylates, triacrylates, tetraacrylates, dimethacrylates, trimethacrylates or tetramethacrylates of polyhydric alcohols such as glycerin, pentaerythritol, trimethylolalkane and tetramethylolalkane (alkane may be methane, ethane or propane); a series of oligoacrylates or oligomethacrylates such as polyester monoacrylates and monomethacrylates having an acryloyl or methacryloyl group in its molecule represented by the general formulas:

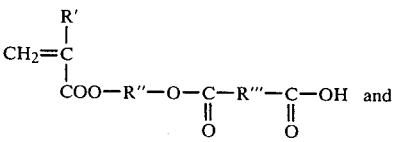
 and

-continued

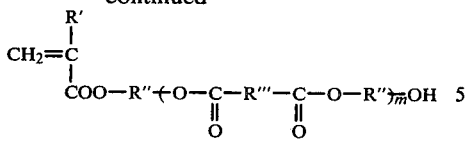

wherein R' is hydrogen or methyl, R" is a $C_{2-10}$ glycol residue, R''' is a $C_{4-8}$ dicarboxylic acid residue, and m is an integer of 1 to 10, for example, monoacryloyloxyethyl maleate, monomethacryloyloxyethyl maleate, monoacryloyloxyisopropyl maleate, monomethacryloyloxyisopropyl maleate, monoacryloyoxyethyl succinate, monoacryloyloxyethyl phthalate, monoacryloxyethyl tetrahydrophthalate, monoacryloyloxyethyl hexahydrophthalate, a monoacrylate or monomethacrylate of a polyesterdiol of phthalic acid with ethyleneglycol, a monoacrylate or monomethacrylate of a polyesterdiol of phthalic acid with propyleneglycol, a monoacrylate or monomethacrylate of a polyesterdiol of hexahydrophthalic acid with ethyleneglycol, and a monoacrylate or monomethacrylate of a polyesterdiol of hexahydrophthalic acid with propyleneglycol, polyester diacrylates and dimethacrylates represented by the general formula,

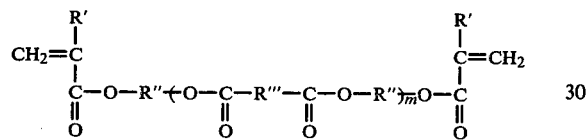

wherein R', R", R''' and m are as defined above, and polyester polyacrylates and polymethacrylates represented by the general formula,

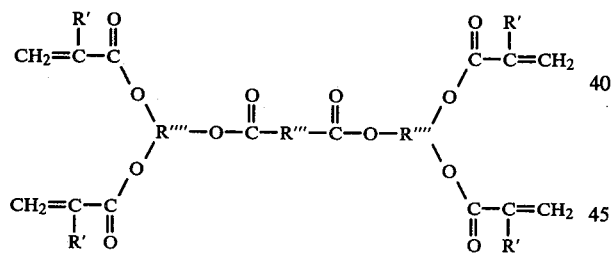

wherein R' and R''' are as defined above and R'''' is a $C_{3-5}$ triol residue; diallylidenepentaerythritol and its modified materials, 2,2'-bis(4-methacryloxydiethoxyphenyl)propane, 2,2'-bis(4-acryloxydiethoxyphenyl)-propane, and 2,2'-bis(4-acryloxypropyloxyphenyl)propane. Such photopolymerizable unsaturated monomer is used in an amount of 5 to 200 weight %, preferably 10 to 100 weight %, based on the weight of the copolymer. It is also possible to use a mixture of two or more of said photopolymerizable unsaturated monomers, provided that the total amount thereof is within said range. If the amount of such monomer or monomers added is less than 5 weight %, there is provided no satisfactory hardening of the photosensitive resin layer or desired improvement of mechanical strength of the obtained printing plate. However, use of said monomer or monomers in excess of 200 weight % results in badly impaired rubber elasticity of the copolymer and reduced solvent resistance.

According to the present invention, it was found that a photosensitive resin flexographic printing plate with splended rubber elasticity can be obtained from a photosensitive resin composition prepared by blending an alkoxyalkyl acrylate or methacrylate or alkoxypolyalkyleneglycol acrylate or methacrylate expressed by the following general formula:

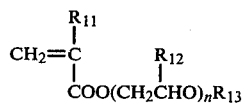

where $R_{11}$ and $R_{12}$ represent hydrogen or a methyl group, $R_{13}$ represents an alkyl group having 1 to 12 carbon atoms, and n represents an integer of 1 to 23 such as for example methoxyethyl acrylate or methacrylate, ethoxyethyl acrylate or methacrylate, propoxyethyl acrylate or methacrylate, butoxyethyl acrylate or methacrylate, methoxyisopropyl acrylate or methacrylate, ethoxyisopropyl acrylate or methacrylate, propoxyisopropyl acrylate or methacrylate, butoxyisopropyl acrylate or methacrylate, methoxydiethyleneglycol acrylate or methacrylate, ethoxydiethyleneglycol acrylate or methacrylate, propoxydiethyleneglycol acrylate or methacrylate, butoxydiethyleneglycol acrylate or methacrylate, methoxydipropyleneglycol acrylate or methacrylate, ethoxydipropyleneglycol acrylate or methacrylate, propoxydipropyleneglycol acrylate or methacrylate, butoxydipropyleneglycol acrylate or methacrylate, methoxytetraethyleneglycol acrylate or methacrylate, methoxynonaethyleneglycol acrylate or methacrylate, methoxytetrapropyleneglycol acrylate or methacrylate, methoxynonapropyleneglycol acrylate or methacrylate or the like, so that the acrylate or methacrylate will be contained in an amount of 5 to 95 weight %, preferably 10 to 80 weight %, based on the total amount of the photopolymerizable unsaturated monomer or monomers used. It is not that use of such photopolymerizable unsaturated monomer or monomers affords even higher flexibility and rubber elasticity to the obtained photosensitive resin plate owing to the excellent flexibility characteristic originating from the side chain ether groups. If the amount of the photopolymerizable unsaturated monomer or monomers expressed by the general formula:

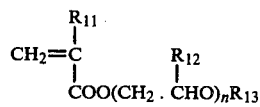

is less than 5 weight %, no satisfactory effect of improving flexibility and rubber elasticity is given to the photosensitive resin plate, while if said amount exceeds 95 weight %, although the above-said improving effect is provided to a satisfactory degree, the photo-setting rate is lowered in the step of forming a latent image by exposing the photosensitive resin layer to ultraviolet rays, so that a long exposure time is required for obtaining a plate which can well stand practical use.

Usually, a minute quantity of a heat polymerization inhibitor such as p-methoxyphenol is contained in the commercially produced photopolymerizable unsaturated monomers, but such substance produces no adverse effect during exposure of the photosensitive resin layer. It can rather act as a storage stabilizer for the photosensitive resin composition, so that there is no need for removing such heat polymerization inhibitor from the photopolymerizable unsaturated monomer when using the latter for preparation of said composition. If need be, a hydroxy aromatic compound such as hydroquinone, p-methoxyphenol, p-tert-butylcatechol, 2,6-di-tert-butyl-p-cresol or pyrogallol, a quinone such as benzoquinone, p-toluquinone or p-xyloquinone, or an amine such as phenyl-α-naphthylamine may be added in an amount of 0.01 to 2 weight % based on the weight of the copolymer.

A further study on the storage stabilizers revealed that a higher storage stabilization effect than provided by the above-said substance can be obtained by using a nitrosophenylhydroxylamine such as aluminum-N-nitrosophenylhydroxylamine or ammonium-N-nitrosophenylhydroxylamine, a dithiocarbamic acid metal salt such as zinc dimethyldithiocarbamate, zinc diethyldithiocarbamate, zinc dipropyldithiocarbamate, zinc dibutyldithiocarbamate, nickel dibutyldithiocarbamate or tellurium diethyldithiocarbamate, a thiuram such as tetramethylthiuram monosulfide or tetramethylthiuram disulfide. These storage stabilizers may be used either singly or in admixture in an amount within the range of 0.01 to 2 weight % based on the copolymer. Use of such stabilizer or stabilizers in an amount of less than 0.01 weight % can not provide sufficient storage stabilization effect to allow long-time storage of the product, while addition of such stabilizer(s) in excess of 2 weight % may cause coloration of the photosensitive resin composition or lowering of sensitivity or may invite worsening of compatibility with the photosensitive resin composition to cause non-uniform dispersion of the stabilizer(s).

The photosensitive resin composition of this invention comprising a copolymer of a conjugated diolefinic hydrocarbon, an α,β-ethylenically unsaturated carboxylic acid and a monoolefinically unsaturated compound, a photopolymerizable unsaturated monomer, a photosensitizer and a storage stabilizer may be obtained either by adding relevant quantities of a suitable photopolymerizable unsaturated monomer, photosensitizer and storage stabilizer in a solution of said copolymer after polymerization, sufficiently mixing and agitating said materials to form a uniform solution, and then removing the solvent under reduced pressure while heating the mixture, or by first removing the solvent under reduced pressure, making the copolymer into a highly viscous or solid mass and then adding and mixing a photopolymerizable unsaturated monomer, photosensitizer and storage stabilizer under heating. The thus obtained photosensitive resin composition can be easily formed into a liquid photosensitive resin composition or a rubber-like solid photosensitive resin composition, so that it is possible to produce a photosensitive resin relief printing plate by first forming said composition into a film with a predetermined thickness by using a spacer or spacers with a proper thickness, or spreading the composition on a support by a roll coater or other means, or forming a photosensitive resin layer of a predetermined thickness by compression molding, extrusion molding or other means, then exposing the thus formed film or layer of said composition through a negative film and then developing the same. This photosensitive resin plate has good rubber elasticity and hence is well suited for use as a flexographic printing plate. As the support used as base for the resin layer, there is suitable a sheet material having substantially the same degree of rubber elasticity as said photosensitive resin composition, such as for example natural rubber, styrene-butadiene rubber, butadiene rubber, acrylonitrile-butadiene rubber, isoprene rubber, ethylene-propylene rubber, crystalline 1,2-butadiene resin or soft vinyl chloride resin. In applications where no high rubber elasticity is required for the support, it is possible to use a film made of such material as polyester, polypropylene, polystyrene, nylon, vinylidene chloride or polyethylene. Also, a sand-grained aluminum plate, iron plate, zinc plate or magnesium plate may be used as the support where the photosensitive composition of this invention is intended for use in the field of newspaper printing or general commercial printing.

One of the outstanding advantages of the composition of this invention is good developability with a dilute alkaline solution or water. The alkali used for this purpose may be of a commonly employed type. For instance, a low-concentration (about 0.1 to 1.0%) aqueous solution of sodium hydroxide, potassium hydroxide, lithium hydroxide, ammonia, sodium carbonate, potassium carbonate, lithium carbonate or the like may be used as the developing solution.

Naturally, the photosensitive resin composition of this invention can be developed not only with such an alkaline solution but also with an organic solvent such as an alcohol, a ketone, an aromatic hydrocarbon or the like.

As the photosensitive resin composition of this invention is high in photosensitivity, the exposure time can be minimized. Also, as such composition has very high solubility in a dilute alkaline solution or water, development can be accomplished in 1 to 2 minutes. Further, as the photosensitive resin relief printing plate thus made from the composition of this invention can be put into printing immediately after drying, marked improvements are realized over the conventional complicated process and time for manufacture of the flexographic printing rubber plates. Although the printing plate made from the composition of this invention is of course capable of printing with a solvent type flexographic printing ink, it also allows use of an aqueous flexographic printing ink which is replacing the solvent type ink for the reason of atmospheric pollution, because the composition of this invention, though soluble in alkali, has high water resistance.

The photosensitive resin composition provided according to this invention is not limited in its use to production of the resin plates for flexographic printing but can be applied for a wide variety of purposes, including use as plate material for newspaper and other general commercial printing or offset printing or as photosensitizing material for nameplates, printed circuit, displays, photo-adhesives, etc.

Now the present invention is described in further detail by way of embodiments thereof, but this invention is not restricted in any way by these embodiments if they don't go beyond the scope and spirit of this invention.

EXAMPLE 1

(1) Synthesis of copolymer 60 grams of 2,2'-azobisisobutyronitrile was fed into a 5000-ml Pyrex glass made pressure bottle and, after displacing the air in the pressure bottle sufficiently with nitrogen, 1120 ml of solvent methanol was supplied into the bottle. After further adding 1.94 moles of styrene, 5.81 moles of methyl methacrylate and 2.90 moles of methacrylic acid, the pressure bottle was immersed in a dry ice-ethanol coolant and 8.7 moles of butadiene was supplied into the bottle. The mouth of the pressure bottle was closed with rubber packing and capped with a crown. The pressure bottle was set in a constant temperature bath at 75° C. and a polymerization reaction was carried out for 24 hours while rotating the pressure bottle. After the completion of polymerization, the conversion was calculated from the solid content. It was 98.4%. The number-average molecular weight of the copolymer thus obtained, as measured by a vapor pressure osmometer, was 35,000.

(2) Preparation of photosensitive resin composition 159.2 grams of a 62.8 weight % solution of the copolymer (butadiene/styrene/methyl methacrylate/methacrylic acid=45/10/30/15 by molar ratio) obtained from the polymerization described in (1) above, and 40.0 grams of nonaethyleneglycol dimethacrylate as photopolymerizable unsaturated monomer, 2.0 grams of benzoinisopropylether as photosensitizer and 0.1 grams of hydroquinone as storage stabilizer were put into a 500 ml three-necked separable flask and mixed and agitated well until a homogeneous solution was formed.

This separable flask was then immersed in a water bath controlled at about 40° C. and the solvent methanol was removed under reduced pressure while agitating the mixture to obtain a viscous photosensitive resin composition.

(3) Plate making 5.0 grams of the photosensitive resin composition obtained from the above-described process (2) was placed on a styrene-butadiene rubber sheet (with area of 64 cm² and thickness of 1.0 mm) to form a 1.0 mm photosensitive resin layer by using a 1.0 mm spaced applicator. A negative film with optical density of 3.5 was placed over the resin layer while maintaining a distance of 0.3 mm therefrom, and they were exposed to the ultraviolet rays for 60 seconds by a 250 W ultra-high-pressure mercury lamp set at a distance of 60 cm from the upper surface of the resin layer. After exposure, a 0.5% aqueous sodium hydroxide solution was sprayed to the resin layer for 2 minutes to develop it, whereby the unexposed area was perfectly dissolved away and a resin relief printing plate with good fidelity to the original was obtained. This resin relief printing plate had good rubber elasticity and its rubber hardness (Shore A hardness, measured at 20° C.) was 60. Separately from this, the resin layer was exposed over its entire area for 60 seconds without interposing a negative film and stamped into a disc with a diameter of 3.5 cm, and this disc was immersed in warm water controlled at 40° C. and the degree of swelling was measured 24 hours thereafter. The degree of swelling was 0.2%, indicating almost no water absorption.

(4) Printing

When the resin relief printing plate obtained in the above-said process was used for printing with black relief printing ink, there were obtained the prints with very good ink transferability.

EXAMPLES 2-4

The copolymers shown in Table 1 were obtained through polymerization practiced in the same way as in Example 1 by using methanol as solvent, and resin relief printing plates were made by using these copolymers in the manner described in Example 1. Any of the printing plates obtained was perfectly devoid of the unexposed area and low in rubber hardness, and when used for printing, they provided the prints with good ink transferability. Increase of the methacrylic acid content results in an increase of affinity to water, but such increase of water affinity, as determined by examining water resistance, was not so conspicuous.

TABLE 1

| Example No. | BD/ST/MMA/MAA | Shore A hardness | Water resistance (%) |
| --- | --- | --- | --- |
| 2 | 45/10/35/10 | 65 | ≈0 |
| 3 | 45/10/20/25 | 65 | 0.3 |
| 4 | 45/10/10/35 | 70 | 0.5 |

(Note)
BD = 1,3-butadiene,
ST = styrene,
MMA = methyl methacrylate,
MAA = methacrylic acid.
These abbreviations apply in the following descriptions.

EXAMPLES 5-8

Photosensitive resin relief printing plates were manufactured in the completely same way as in Example 1, except for use of the photopolymerizable unsaturated monomers shown in Table 2 below in admixture with the copolymer synthesized in Example 1. Each of the printing plates thus obtained was low in rubber hardness and excellent in water resistance and provided the prints with good ink transferability.

TABLE 2

| Example No. | Photopolymerizable unsaturated monomer | Shore A hardness | Water resistance (%) |
| --- | --- | --- | --- |
| 5 | Diallylidenepentaerythritol | 45 | 0.2 |
| 6 | 14-G/2-HEMA = 70/30 | 60 | 0.5 |
| 7 | Trimethylolpropane methacrylate | 80 | ≈0 |
| 8 | Monoacrylate of polyesterdiol of hexahydrophthalic acid with ethyleneglycol | 47 | ≈0 |

(Note)
14-G = tetradecaethyleneglycol dimethacrylate,
2-HEMA = 2-hydroxyethyl methacrylate.
The proportions are by weight.

EXAMPLES 9-18

The copolymers shown in Table 3 were obtained after the manner of Example 1 by using ethanol as solvent, and the solutions of these copolymers were heated at 40° C. under reduced pressure to remove the solvent ethanol, obtaining small rubber-like masses. Then a monomer prepared by mixing 2,2'-bis(4-methacryloxydiethoxyphenyl)-propane and lauryl methacrylate in the ratio of 75 to 25 (by weight) was added to each said mass in an amount of 80 grams per 100 grams of said copolymer, followed by addition of 2.0 grams of benzoinisopropyl ether and 0.1 gram of p-methoxyphenol and continuous agitation of the mixture, thereby obtaining a transparent viscous photosensitive resin composition. Each of the thus obtained compositions, when subjected to the same plate making process as in Example 1, gave an excellent printing plate with good rubber elasticity and water resistance as shown in Table 3 below, and such printing plate, when used for printing, gave high-quality prints.

TABLE 3

| Example No. | Copolymer composition | Shore A hardness | Water resistance (%) |
|---|---|---|---|
| 9 | BD/MAA (61/39) | 40 | 0.8 |
| 10 | BD/ST/MAA (43/30/27) | 67 | 0.4 |
| 11 | BD/MMA/MAA (43/42/15) | 65 | ≈0 |
| 12 | BD/AN/MAA (34/45/21) | 60 | ≈0 |
| 13 | BD/ST/MMA/AA (43/7/34/16) | 68 | 0.2 |
| 14 | BD/BA/AA (50/25/25) | 45 | 0.3 |
| 15 | BD/ST/EMA/MAA (50/8/27/15) | 55 | ≈0 |
| 16 | BD/ST/BMA/MAA (50/8/27/15) | 55 | ≈0 |
| 17 | BD/ST/2-EHMA/MAA (53/10/20/17) | 50 | ≈0 |
| 18 | BD/ST/AN/MAA (45/21/15/19) | 70 | 0.2 |

(Note)
AN = acrylonitrile,
AA = acrylic acid,
IA = itaconic acid,
EMA = ethyl methacrylate,
BMA = n-butyl methacrylate,
2-EHMA = 2-ethylhexyl methacrylate,
BA = n-butyl acrylate.

COMPARATIVE EXAMPLE 1

A viscous photosensitive resin composition containing a copolymer with the composition of butadiene/styrene/methyl methacrylate/methacrylic acid=5/10/70/15 as a component was prepared in the completely same way as in Example 9, and a printing plate was obtained from this composition by following the process of Example 1. This printing plate, although satisfactory in water resistance, had little rubber elasticity, with Shore A hardness thereof being as high as 98, and was unfit for use as a flexographic printing plate.

COMPARATIVE EXAMPLE 2

A viscous photosensitive resin composition containing a copolymer with the composition of butadiene/styrene/methyl methacrylate/methacrylic acid=45/10/43/2 as an ingredient was prepared in the completely same way as in Example 9, and this resin composition was exposed through a negative film and developed by spraying a 0.5% aqueous sodium hydroxide solution after the manner of Example 1. However, the unexposed area did not dissolve away and there could not be obtained a printing plate with good alkali developability aimed at in this invention.

EXAMPLE 19

15.9 grams (10 grams measured as copolymer) of a 62.8 weight % solution of a copolymer having the composition of butadiene/styrene/methyl methacrylate/methacrylic acid=45/10/30/15 (by molar ratio) was mixed with 0.3 gram of 2,6-bis(p-azidobenzal) cyclohexanone as photo-crosslinking agent and 0.1 gram of hydroquinone as stabilizer, and then the mixture was further added with xylene to prepare 67 grams of a 15 weight % solution of the copolymer. This solution was applied on a 0.3 mm thick sand-grained aluminum plate by using a whirler to form a resist layer with thickness (after drying) of 12μ. This resist layer was exposed to light with intensity of 80 W/m² through a negative film for 10 seconds by using a 250-W ultra-high pressure mercury lamp and then developed with toluene, whereby there was obtained a positive image with good fidelity to the original. This was subjected to 0.17 mm deep etching with an etching solution prepared by adding copper sulfate in a 10% aqueous hydrochloric acid solution, but no release of the resist film took place and an excellent relief image was obtained. The resist film adhering to the image surface could be stripped off by immersing the relief image in n-butyl acetate and then rubbing lightly.

EXAMPLE 20

A resist layer was similarly formed on a copper plate by using the same photosensitizing solution as employed in Example 19, and after exposure, it was developed with a 0.5% aqueous sodium hydroxide solution, whereby an excellent positive image was obtained.

EXAMPLE 21

There was prepared a solution of a copolymer having the composition of isoprene/styrene/ethyl methacrylate/methacrylic acid=50/10/20/20 (by molar ratio) polymerized after the manner of Example 1 by using ethanol as solvent, and after removing ethanol under reduced pressure, a 2% aqueous solution of sodium hydroxide was added to form a 10% solution, which was further added with 4,4'-diazidostilbene-2,2'-disulfonic acid in an amount of 2 weight % of the copolymer to obtain a homogeneous solution.

This solution was treated similarly to Example 20 to obtain an excellent positive image on a copper plate.

EXAMPLE 22

A solution prepared by dissolving 6.0 grams of sodium hydroxide in 105 grams of a mixed solvent of water/methanol=26.3/78.7 (by weight ratio) was added into 100 grams of a 61.5 weight % solution of a copolymer of butadiene/styrene/2-ethylhexyl methacrylate/methacrylate acid=50/10/25/15 (by molar ratio) with number-average molecular weight of 24,000 obtained from polymerization in the completely same way as in Example 1, and they were mixed and agitated well to form a homogeneous solution. (Sodium hydroxide was equimolar with methacrylic acid contained in the copolymer).

To this solution were further added 30.8 grams of nonaethyleneglycol methacrylate as photopolymerizable unsaturated monomer, 1.85 grams of benzoinisopropyl ether as photosensitizer and 0.06 gram of hydroquinone as storage stabilizer, and they were mixed well under agitation until they were perfectly dissolved. This solution was put into a three-necked separable flask with internal capacity of 500 ml and agitated well, and then methanol and water were eliminated while continuing agitation to obtain a highly viscous photosensitive resin composition.

5.0 grams of this photosensitive resin composition was poured onto a styrene-butadiene rubber sheet (8×8 cm in area and 1.0 mm in thickness) and squeezed with an applicator positioned 1.0 mm away from the sheet surface to thereby form a 1.0 mm thick resin layer. This photosensitive resin layer was then exposed through a negative film, for 60 seconds, to the ultraviolet rays from a 250 W ultra-high pressure mercury lamp located at a distance of 60 cm from the upper surface of the resin layer while maintaining a distance of 0.3 mm between said resin layer and the negative film. The unexposed area was dissolved away by 2-minutes spray of warm water kept at constant temperature of 40° C. over the plate surface, and additional 5-minute drying under heating at 80° C. gave a printing plate. The printing plate thus obtained had high fidelity to the original and its rubber hardness (Shore A hardness) was 55°, assuring excellent fitness for use as a flexographic printing plate.

Printing on fine paper by using this printing plate and a black-colored relief printing ink produced prints were splendid ink transferability.

EXAMPLES 23-26

An inorganic alkali, an alkali salt and an amine compound shown in Table 4, each being equimolar with methacrylic acid in the copolymer, were dissolved respectively in a mixed solvent of water and methanol, and each of these solutions was mixed in the same copolymer solution as used in Example 22, followed by sufficient agitation to form a homogeneous solution. Then each of the solutions thus formed was added with nonaethyleneglycol dimethacrylate, benzoinisopropyl ether and hydroquinone under agitation in the completely same way as in Example 22 and then the solvent was removed under reduced pressure to obtain photosensitive resin composition.

The compositions thus obtained were in the form of a highly viscous liquid or a rubber-like solid as shown in Table 4. The highly viscous liquid compositions were made into plates by following the procedure of Example 22. On the other hand, a determined amount of the rubber-like composition was laid on a styrene-butadiene rubber sheet through a 1.0 mm spacer and subjected to hot press for 60 seconds under the conditions of 100° C. and 10 kg/cm$^2$ to form a photosensitive resin original plate, and then this original plate, after closely attaching thereto a negative film in vacuum, was exposed for 60 seconds to the light from a 250 W ultra-high mercury lamp at a distance of 60 cm from the upper surface of the plate and then developed by spraying warm water controlled at 40° C. for 2 minutes. The resultant printing plate had high fidelity to the original and was full of flexibility, and printing with this plate provided prints with excellent ink transferability.

TABLE 4

| Example No. | Kind of alkali and amine used | Condition of photosensitive resin composition | Shore A hardness (°) |
|---|---|---|---|
| 23 | Potassium hydroxide | Highly viscous liquid | 60 |
| 24 | Lithium carbonate | Rubber-like solid | 65 |
| 25 | Ammonia | Highly viscous liquid | 50 |
| 26 | Ethanolamine | Highly viscous liquid | 55 |

EXAMPLES 27-31

The copolymers of the compositions shown in Table 5 were synthesized in the same way as Example 1, and each of these copolymers was added with lithium hydroxide in an amount of equimolar with the α,β-ethylenically unsaturated carboxylic acid contained in the copolymer. These copolymers were then subjected to the completely same plate making process as in Example 23 to obtain printing plates with good fidelity to the original. Any of the printing plates thus obtained had good flexibility and, upon printing, gave prints with excellent ink transferability.

TABLE 5

| Example No. | Polymer composition | Condition of photosensitive composition | Shore A hardness (°) |
|---|---|---|---|
| 27 | BD/2-EHMA/AA = 40/45/15 | Highly viscous liquid | 45 |
| 28 | BD/MAA = 65/35 | Highly viscous liquid | 50 |
| 29 | BD/ST/LMA/MAA = 45/10/30/15 | Highly viscous liquid | 55 |
| 30 | BD/MMA/MAA = 55/25/20 | Rubber-like solid | 70 |
| 31 | BD/α-MST/MAA = 55/25/20 | Rubber-like solid | 75 |

(Note)
LMA = lauryl methacrylate,
α-MST = α-methylstyrene.

EXAMPLES 32-35

Lithium hydroxide was added to the copolymer solutions same as used in Example 22 so that the molar ratio of lithium hydroxide (D) to methacrylic acid (C) in the copolymer became 0.25, 0.50, 0.75 and 1.00, respectively, and the solutions thus prepared were treated in the completely same way as in Example 22 to obtain the respective photosensitive compositions.

The condition of the photosensitive compositions changed from liquid to rubber-like solid depending on the amount of lithium hydroxide added as shown in Table 6. These compositions were developed by spraying warm water of 40° C. after the manner of Examples 22 and 23 to obtain the printing plates. Those compositions to which a small amount of lithium hydroxide was added required much time for development. Each of the printing plates obtained was highly flexible and could produce high-quality prints. By way of comparison, there was similarly prepared a composition with (D)/(C) ratio of 0.03 (Example 36). This composition was incapable of spray development with 40° C. warm water, but could be developed with a 0.5% aqueous sodium hydroxide solution.

TABLE 6

| Example No. | (D)/(C) ratio | Condition of photosensitive composition | Developing time (min) | Shore A hardness (°) |
|---|---|---|---|---|
| 32 | 0.25 | Highly viscous liquid | 10.0 | 52 |
| 33 | 0.50 | Highly viscous liquid | 5.0 | 55 |
| 34 | 0.75 | Rubber-like solid | 2.0 | 58 |
| 35 | 1.00 | Rubber-like solid | 2.0 | 60 |
| 36 | 0.03 | Highly viscous liquid | — | — |

EXAMPLES 37-42

Printing plates were produced in the completely same way as in Example 22 except that the photopolymerizable unsaturated monomer shown in Table 7 were used instead of nonaethyleneglycol dimethacrylate used in Example 22. The printing plates obtained were devoid of the unexposed area as such area was perfectly dissolved by spray development with 40° C. warm water. Also, each of these printing plates had good flexibility and were capable of forming fine prints.

TABLE 7

| Example No. | Photopolymerizable unsaturated monomer | Condition of photosensitive resin composition | Shore A hardness (°) |
|---|---|---|---|
| 37 | Tetradecaethylene-glycol dimethacrylate | Highly viscous liquid | 55 |
| 38 | TMPT/2-EHMA = ¼ | Highly viscous liquid | 70 |
| 39 | 2,2'-bis(4-acryloxydiethoxyphenyl) propane | Highly viscous liquid | 70 |
| 40 | Monoacrylate of polyesterdiol of hexahydrophthalic acid with ethyleneglycol | Highly viscous liquid | 55 |
| 41 | Ester of 2-hydroxyethyl acrylate with phthalic anhydride (2:1 molar ratio) | Highly viscous liquid | 60 |
| 42 | TMPT/LMA = ¼ | Highly viscous liquid | 65 |

(Note)
TMPT = trimethylolpropane trimethacrylate.
The ratio is by weight.

EXAMPLE 43

100 grams of a 50 weight % methanol solution of a copolymer of butadiene/maleic acid=71/29 (by molar ratio) with number-average molecular weight of 17,500 obtained from polymerization in the same way as in Example 1, and 40 grams of nonaethyleneglycol dimethacrylate, 1 gram of benzoinisopropyl ether and 0.05 gram of hydroquinone were put into a 300 ml three-necked separable flask and well mixed and agitated to form a homogeneous solution, and while heating the solution at about 40° C., the solvent methanol was distilled off under vacuum to prepare a viscous photosensitive resin composition.

A 1.5 mm wide spacer was put on a polyester film (8×8 cm) in area and 100μ in thickness), and about 9 grams of this composition was poured into the spacer, after which a 100μ polyester film was put on the composition and the resulting assembly was pressed through a 5 mm thick glass plate. The resulting laminate was irradiated for 1.0 second with ultraviolet rays from a 250 W ultra-high pressure mercury lamp located at a distance of 60 cm from the polyester film surface. When the glass plate was removed, a trace of the viscous composition remained of the lower polyester film. After photo-setting, a 0.5% aqueous sodium hydroxide solution was sprayed for 1 minute over the photosensitive resin layer adhering to the upper polyester film to perfectly remove the unexposed area, followed by 10-minute drying under heating at 80° C. The thickness of the photo-set layer formed on the polyester film was 1330μ. This shows that the photo-setting rate of this composition was as high as 1330 μ/sec.

Separately from this, about 5 grams of said composition was spread on a styrene-butadiene rubber sheet (8×8 cm in area and 2.0 mm in thickness) and squeezed by means of an applicator placed 1.0 mm away from the rubber sheet to thereby form a 1.0 mm thick photosensitive resin layer. A negative film with optical density of 3.5 was fixed at a position 0.3 mm away upwardly of the photosensitive resin layer, and said resin layer was exposed through said negative film, for 30 seconds, to the ultraviolet rays from a 250 W ultra-high pressure mercury lamp located at a distance of 60 cm upwardly of said layer, followed by one-minute development with a 0.5% aqueous sodium hydroxide solution, whereby a printing plate with good fidelity to the original was obtained. The printing plate thus obtained had rubber hardness of 50 (Shore A hardness, measured at 20° C.) and proved well fit for use as a flexographic printing plate. Also, printing by use of this printing plate and a relief printing ink gave prints with excellent ink transferability.

EXAMPLE 44

A copolymer of butadiene/acrylic acid=70/30 (by molar ratio) was synthesized by following the procedure of Example 43, and a viscous photosensitive composition was prepared therefrom in the completely same way as in Example 1. The photo-setting rate of this composition was as low as 34 μ/sec.

EXAMPLES 45-55

The copolymers having the compositions shown in Table 8 were synthesized by copying after the process of Example 1, and the photosensitive resin compositions were prepared therefrom in the completely same manner as in Example 43. The photo-setting rate of these compositions was measured, and the photosensitive resin relief printing plates were made from these compositions through a negative film and their rubber hardness was determined. It was found that a printing plate with high sensitivity and suited for flexographic printing could be obtained from any of said copolymers. Also, each of these printing plates was capable of forming prints with excellent in transferability.

TABLE 8

| Example No. | Polymer composition | Photo-setting rate (μ/sec) | Rubber hardness |
|---|---|---|---|
| 45 | BD/FA = 65/35 | 1370 | 50 |
| 46 | BD/IA = 60/40 | 1480 | 55 |
| 47 | BD/MA/AA = 63/18/19 | 530 | 49 |
| 48 | BD/FA/AA = 63/18/19 | 550 | 50 |
| 49 | BD/IA/AA = 65/15/20 | 640 | 57 |
| 50 | BD/MA/MMA = 57/20/23 | 580 | 53 |
| 51 | BD/MA/AN = 50/16/34 | 650 | 62 |
| 52 | BD/MA/ST = 60/20/20 | 250 | 65 |
| 53 | BD/MA/EA = 57/19/24 | 320 | 51 |
| 54 | BD/MA/EA = 61/20/19 | 280 | 48 |
| 55 | BD/MA/2-EHMA = 65/21/14 | 240 | 45 |

(Note)
FA = fumaric acid,
IA = itaconic acid,
MA = maleic acid,
EA = ethyl acrylate.

EXAMPLES 56-60

Photosensitive resin compositions were prepared in the same was as in Example 43 except for use of the photopolymerizable unsaturated monomers shown in Table 9 for the copolymer, and their photo-setting rate and rubber hardness were measured. From these compositions were obtained flexographic printing plates with high sensitivity, fine-line retainability and flexibility. Printing with these plates gave prints with excellent ink transferability.

TABLE 9

| Example No. | Photopolymerizable unsaturated monomer | Photo-setting rate (μ/sec) | Rubber hardness |
|---|---|---|---|
| 56 | Tetradecaethyleneglycol dimethacrylate | 1240 | 45 |
| 57 | 9-G/CHMA = 80/20 | 1150 | 58 |
| 58 | 9-G/2-HPMA = 80/20 | 1350 | 62 |
| 59 | 9-G/AA = 70/30 | 1410 | 72 |

TABLE 9-continued

| Example No. | Photopolymerizable unsaturated monomer | Photo-setting rate (μ/sec) | Rubber hardness |
|---|---|---|---|
| 60 | Ester of 2-hydroxyethyl methacrylate with phthalic anhydride (2:1 molar ratio) | 1050 | 70 |

(Note)
9-G = nonaethyleneglycol dimethacrylate,
CHMA = cyclohexyl methacrylate,
2-HPMA = 2-hydroxypropyl methacrylate.
The proportion is by weight.

EXAMPLE 61

A solution prepared by dissolving 4.8 grams of sodium hydroxide (corresponding to 0.3 equivalent of carboxyl groups of maleic acid unit in the copolymer) in a mixed solvent of water/methanol=30/70 (by weight ratio) was added to 100 grams of a methanol solution of the same copolymer as used in Example 43, and they were mixed well under agitation to form a homogeneous solution. From this solution was prepared a viscous photosensitive resin composition in the same manner as in Example 43 except for use of water heated to 40° C. as developing solution, and the photo-setting rate and rubber hardness of the obtained composition were measured. They were 1250 μ/sec and 62, respectively. A printing plate was then made from this composition with use of a negative film. This printing plate had high fidelity to the original and was capable of forming prints with excellent quality.

EXAMPLE 62

0.15 gram of 2,6-bis(p-azidobenzal) cyclohexanone, 0.05 grams of hydroquinone and 23.3 grams of xylene were added to 10 grams of a methanol solution of the same copolymer as used in Example 43, and the mixture was well agitated to form a 15 weight % photosensitizing solution. This photosensitizing solution was applied on a 0.3 mm thick copper plate by a whirler and dried under heating at 80° C. for 10 minutes, whereby a resist film with thickness of 10μ was formed on the copper plate.

A negative film was attached in vacuo closely to the resist film and the latter was exposed for 2 seconds to a 250 W ultra-high pressure mercury lamp adapted with a filter to lower illuminance to 80 W/m² and then developed with a 0.5% aqueous sodium hydroxide solution for 30 seconds. This treatment gave a positive image with high fidelity to the original. Etching with a 30% ferric chloride solution caused no separation of the resist film, and when the resist layer was removed by immersing in n-butyl acetate, there was obtained an excellent metal etched plate.

EXAMPLE 63

A product obtained by using the same copolymer as used in Example 44 was assayed after the manner of Example 61. Though 2-second exposure resulted in insufficient setting of the resist film, producing an etched metal plate with twisted lines and conspicuous side edges exposure of 10 seconds resulted in an etched metal plate of the same quality as obtained in Example 62.

EXAMPLE 64

126 grams of a 63.5 weight % solution of the copolymer of butadiene/methyl methacrylate/acrylic acid=55/30/15 (by molar ratio) with number-average molecular weight of 32,000 obtained from polymerization after the manner of Example 1 was put into a 500-ml three-necked separable flask equipped with a stirring rod, and then 32 grams of ethoxydiethyleneglycol acrylate and 32 grams of nonaethyleneglycol dimethacrylate (concentration of ethoxydiethyleneglycol acrylate in the total amount of photopolymerizable unsaturated monomers being 50 weight %) as photopolymerizable unsaturated monomers, 2.4 grams of benzoinisopropyl ether as photosensitizer and 0.4 gram of p-methoxyphenol as storage stabilizer were added and stirred until a homogeneous solution was formed. Then the separable flask was immersed in a water bath controlled at 40° C. and methanol was distilled off under vacuum while stirring the mixture to obtain a liquid photosensitive resin composition. About 9 grams of this liquid photosensitive resin composition was poured onto a polyester film (8×8 cm in area and 100μ in thickness) and, after disposing a 1.5 mm thick spacer on the outside of the polyester film, a glass plate (13×13 cm in area and 5 mm in thickness) having closely attached thereto a negative film formed from a polybutadiene resin film (20μ in thickness) was pressed against the composition from above thereof to form a 1.4 mm thick photosensitive resin layer. This photosensitive resin layer was exposed for 2 minutes to the ultraviolet rays from a 250 W ultra-high pressure mercury lamp at a distance of 60 cm from and above the glass plate and then developed by spraying a 0.5% aqueous sodium hydroxide solution for 1 minute, thereby forming a printing plate with high fidelity to the original. Separately from this, the composition was subjected to 3-minute overall exposure with no interposition of negative film by using a 3.0 mm thick spacer to form a photoset layer. Rubber hardness of this layer (Shore A hardness, measured at 20° C.) was 39 and its impact resiliency (measured according to JIS K-6301) was 47%. These figures indicate that the above-said printing plate can be used as an excellent photosensitive resin flexographic printing plate. When printing was made on corrugated cardboard by using the printing plate thus obtained, there were obtained prints with excellent ink transferability despite of the rough cardboard surface.

EXAMPLE 65

A photosensitive resin plate was produced by repeating the same procedure as in Example 64, except using 2-ethylhexyl acrylate instead of the ethoxydiethyleneglycol acrylate. Rubber hardness of this plate was 51 and its impact resiliency was 10%.

EXAMPLES 66-71

Printing plates were produced by following the procedure of Example 64, except changing the proportions of ethoxydiethyleneglycol acrylate and nonaethyleneglycol dimethacrylate, and rubber hardness and impact resiliency of the plates obtained were measured, obtaining the results shown in Table 10 below.

TABLE 10

| Example No. | Concentration by weight of ethoxydiethyleneglycol acrylate in total amount of photopolymerizable unsaturated monomers | Rubber hardness | Impact resiliency (%) |
|---|---|---|---|
| 66 | 10 | 50 | 25 |
| 67 | 30 | 43 | 31 |
| 68 | 70 | 35 | 50 |

TABLE 10-continued

| Example No. | Concentration by weight of ethoxydiethyleneglycol acrylate in total amount of photopolymerizable unsaturated monomers | Rubber hardness | Impact resiliency (%) |
|---|---|---|---|
| 69 | 90 | 33 | 51 |
| 70 | 0 | 57 | 8 |
| 71 | 100 | 25 | 20 |

The photosensitive resin plates in Examples 66–69 were low in hardness and possessed of high rubber elasticity and proved to be excellent photosensitive resin flexographic printing plates. In Example 70, absence of ethoxydiethyleneglycol acrylate in the photopolymerizable unsaturated monomer component resulted in high rubber hardness and reduced impact resiliency. When ethoxydiethyleneglycol alone was used as photopolymerizable unsaturated monomer component in Example 71, the photo-setting rate was lower but practicable.

EXAMPLES 72–77

Plates were produced in the completely same manner as in Example 64 except for use of photopolymerizable unsaturated monomers shown in Table 11 in place of the ethoxydiethyleneglycol acrylate, and rubber hardness and impact resiliency of the plates obtained were measured.

TABLE 11

| Example No. | Photopolymerizable unsaturated monomer | Rubber hardness | Impact resiliency (%) |
|---|---|---|---|
| 72 | Ethoxyethyl acrylate | 52 | 33 |
| 73 | Ethoxyethyl methacrylate | 53 | 30 |
| 74 | Butoxyethyl acrylate | 38 | 42 |
| 75 | Methoxytetraethyleneglycol methacrylate | 47 | 44 |
| 76 | Methoxynonaethyleneglycol methacrylate | 42 | 48 |
| 77 | Methoxypolyethyleneglycol methacrylate (n = 23) | 35 | 52 |

Any of the plates provided from these Examples could well serve as a photosensitive resin flexographic printing plate, and the prints obtained from use of these plates were fine.

EXAMPLES 78–83

28 grams of butoxyethyl acrylate, 42 grams of nonaethyleneglycol dimethacrylate (concentration of butoxyethyl acrylate in the total amount of photopolymerizable unsaturated monomers being 40 weight %), 3 grams of benzoinisopropyl ether and 0.5 gram of p-methoxyphenol were added to 100 grams (dry weight) of each of the copolymer solutions shown in Table 12 prepared from polymerization after the manner of Example 1, and then methanol was distilled off under vacuum to obtain a liquid photosensitive resin composition. Printing plates were made from the respective obtained compositions, and their rubber hardness and impact resiliency were measured. Corrugated cardboard can be well printed by using these printing plates, indicating high fitness of these photosensitive resin plates for flexographic printing.

TABLE 12

| Example No. | Copolymer composition | Rubber hardness | Impact resiliency (%) |
|---|---|---|---|
| 78 | BD/EMA/AA = 55/25/20 | 42 | 50 |
| 79 | BD/n-BA/AA = 58/17/25 | 50 | 41 |
| 80 | BD/2-EHMA/IA = 68/18/14 | 59 | 33 |
| 81 | BD/LMA/IA = 70/15/15 | 58 | 37 |
| 82 | BD/AN/IA = 75/20/5 | 54 | 45 |
| 83 | BD/ETA/AA = 65/15/20 | 43 | 47 |

(Note)
ETA = ethoxyethyl acrylate.
The proportion is molar ratio.

EXAMPLES 84–89

The photopolymerizable unsaturated monomers shown in Table 13 were added to 100 grams (dry weight) of the copolymer solution comprising butadiene/n-butyl acrylate/acrylic acid=58/17/25 (by molar ratio) used in Example 79, and then 2.5 grams of benzoinmethyl ether and 0.5 gram of hydroquinone were further added to each of said mixed solutions to form a homogeneous solution. After distilling off methanol under vacuum, there were obtained transparent liquid photosensitive resin compositions.

TABLE 13

| Example No. | Photopolymerizable unsaturated monomers | Total amount of photopolymerizable unsaturated monomers (g) | Concent. of ethoxydiethyleneglycol diacrylate in total amount of p.u.m. (weight %) | Rubber hardness | Impact resiliency (%) |
|---|---|---|---|---|---|
| 84 | Ethoxydiethyleneglycol acrylate/TMPT | 60 | 83.3 | 60 | 49 |
| 85 | Ethoxydiethyleneglycol acrylate/AP-9G | 75 | 40 | 52 | 43 |
| 86 | Ethoxydiethyleneglycol acrylate/AM-8030 | 60 | 83.3 | 61 | 40 |
| 87 | Ethoxydiethyleneglycol acrylate/BPE-4 | 70 | 57 | 55 | 53 |
| 88 | Ethoxydiethyleneglycol acrylate/2-HEMA | 55 | 40 | 42 | 55 |
| 89 | Ethoxydiethyleneglycol acrylate/GMA | 55 | 40 | 45 | 51 |

(Note)
AM 8030 = polyester acrylate consisting of adipic acid, glycerine and acrylic acid (0.5/1/2 molar ratio),
AP-9G = nonapropyleneglycol diacrylate,
GMA = glycidyl methacrylate, and
BPE-4 = 2,2'-bis-(4-methacryloxydiethoxyphenyl) propane.

The results of evaluation, rubber hardness and impact resiliency of the printing plates obtained from these compositions were all excellent, and these plates could be effectively used as photosensitive resin flexographic printing plates.

EXAMPLES 90-92

Liquid photosensitive resin compositions were prepared in the completely same way as in Example 64 except for use of the compounds shown in Table 14 as storage stabilizer. Each of these compositions was put into a 100-m-capacity transparent glass made sample bottle and immersed in a constant-temperature bath controlled at 30° C., and change of composition viscosity with time was examined by using a Brookfied type viscometer. The composition of Example 64 was also similarly tested and the test results were also shown in Table 14.

TABLE 14

| Example No. | Storage stabilizer | Composition viscosity (cps) | |
|---|---|---|---|
| | | Just produced | 6 months later |
| 90 | Aluminum-N-nitroso-phenylhydroxylamine | 16800 | 17000 |
| 91 | Zinc diethyldithio-carbamate | 15400 | 16200 |
| 92 | Tetramethylthiuram | 18000 | 19500 |
| 64 | p-Methoxyphenol | 17500 | 155000 |

It was found the storage stabilizers used in Examples 90 to 92 have very excellent storage stabilization effect. It was also possible to produce excellent photosensitive resin flexographic printing plates, with no drop of sensitivity, from these compositions. The stabilization effect of p-methoxyphenol of Example 64 was somewhat lower than those of the compounds of Examples 90 to 92, and storage at a somewhat lower temperature was required for stably preserving the composition using such substance.

What is claimed is:

1. A photosensitive composition, consisting essentially of:
   (I) a copolymer having a molecular weight of 5,000 to 100,000 and prepared by a process consisting essentially of solution radical copolymerizing (A) 10 to 95 mol % of a conjugated diolefinic hydrocarbon, (B) 5 to 90 mol % of an α,β-ethylenically unsaturated carboxylic acid or anhydride and (C) 0 to 85 mol % of a monoolefinically unsaturated compound and
   (II) a photosensitizer or a photosensitive crosslinking agent or mixture thereof which is photosensitively effective with said copolymer.

2. A photosensitive composition, consisting essentially of:
   (I) a copolymer having a molecular weight of 5,000 to 100,000 and prepared by a process consisting essentially of solution radial copolymerizing (A) 10 to 95 mol % of a conjugated diolefinic hydrocarbon, (B) 5 to 90 mol % of an α,β-ethylenically unsaturated carboxylic acid or anhydride and (C) 0 to 85 mol % of a monoolefinically unsaturated compound;
   (II) a photosensitizer which is photosensitively effective with said copolymer; and
   (III) a photo-polymerizable unsaturated monomer.

3. The photosenstive composition as claimed in claim 1, wherein at least a part of the carboxyl groups of the α,β-ethylenically unsaturated carboxylic acid or anhydride in the copolymer (I) have been reacted with an inorganic alkali, an alkali salt or an amine compound.

4. The photosensitive composition as claimed in claim 2, wherein at least a part of the carboxyl groups of the α,β-ethylenically unsaturated carboxylic acid or anhydride in the copolymer (I) have been reacted with an inorganic alkali, an alkali salt or an amine compound.

5. The photosensitive composition as claimed in claim 1, wherein the copolymer (I) consists of (A) 30 to 70 mol % of a conjugated diolefinic hydrocarbon, (B) 10 to 60 mol % of an α,β-ethylenically unsaturated carboxylic acid or anhydride and (C) 0 to 60 mol % of a monoolefinically unsaturated compound.

6. The photosensitive composition as claimed in claim 2, wherein the copolymer (I) consists of (A) 30 to 70 mol % of a conjugated diolefinic hydrocarbon, (B) 10 to 60 mol % of an α,β-ethylenically unsaturated carboxylic acid or anhydride and (C) 0 to 60 mol % of a monoolefinically unsaturated compound.

7. The photosensitive composition as claimed in claim 4, wherein the α,β-ethylenically unsaturated carboxylic acid or anhydride in the copolymer (I) has been reacted with an inorganic alkali, an alkali salt or an amine compound in a proportion of 0.05 to 1.0 equivalent per equivalent of the carboxyl group.

8. The photosensitive composition as claimed in claim 4, wherein the α,β-ethylenically unsaturated carboxylic acid or anhydride in the copolymer (I) has been reacted with an inorganic alkali, an alkali salt or an amine compound in a proportion of 0.2 to 1.0 equivalent per equivalent of the carboxyl group.

9. The photosensitive composition as claimed in claim 4, wherein the inorganic alkali is lithium hydroxide, sodium hydroxide, potassium hydroxide or ammonia, the alkali salt is lithium carbonate, sodium carbonate, potassium carbonate or ammonium carbonate, and the amine compound is a primary amine, a secondary amine, a tertiary amine, an alcohol amine or a cyclic amine.

10. The photosensitive composition as claimed in claim 9, wherein the amine compound is ethylamine, n-propylamine, diethylamine, di-n-propylamine, triethylamine, methyldiethylamine, dimethylethanolamine, triethanolamine or morpholine.

11. The photosensitive composition as claimed in claim 2, wherein the conjugated diolefinic hydrocarbon (A) is a compound represented by the formula,

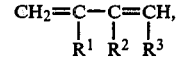

wherein $R_1$ is hydrogen, methyl, ethyl, n-propyl, isopropyl, phenyl, Cl, Br, or I; $R_2$ is hydrogen, methyl or Cl; and $R_3$ is hydrogen or methyl.

12. The photosensitive composition as claimed in one of claims 1 to 10, wherein the conjugated diolefinic hydrocarbon (A) is 1,3-butadiene, isoprene, chloroprene or dimethylbutadiene.

13. The photosensitive composition as claimed in claim 1, wherein the α,β-ethylenically unsaturated carboxylic acid or anhydride (B) is a monocarboxylic acid represented by the formula,

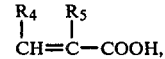

wherein $R_4$ is hydrogen or methyl and $R_5$ is hydrogen, methyl, ethyl or Cl, a dicarboxylic acid having 4 to 5 carbon atoms, an anhydride thereof or a monoester of a dicarboxylic acid.

14. The photosensitive composition as claimed in claim 13, wherein the $\alpha,\beta$-ethylenically unsaturated carboxylic acid or anhydride (B) is selected from the group consisting of acrylic, methacrylic, crotonic, maleic, fumaric, and itaconic acids; maleic and itaconic anhydrides, monomethyl, monoethyl, mono-n-propyl and mono-n-butyl maleates; monomethyl, monoethyl, mono-n-propyl, and mono-n-butyl fumarates, and monomethyl, monoethyl, mono-n-propyl and mono-n-butyl itaconates.

15. The photosensitive composition as claimed in claim 2, wherein the monoolefinically unsaturated compound (C) is styrene, $\alpha$-methylstyrene, o-methylstyrene, m-methylstyrene, p-methylstyrene, p-methoxystyrene, acrylonitrile, methacrylonitrile, vinyl chloride, vinylidene chloride, acrylamide, methacrylamide, vinyl acetate, an acrylic or methacrylic ester expressed by the following formula:

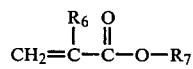

where $R_6$ represents hydrogen or a methyl group and $R_7$ represents an alkyl group with 1 to 18 carbon atoms, a diester of a dicarboxylic acid, an acrylate or methacrylate having a cyclic side chain, an alkoxyalkyl acrylate or methacrylate or alkoxy polyalkyleneglycol acrylate or methacrylate represented by the following formula:

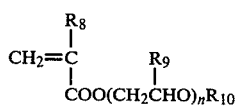

where $R_8$ and $R_9$ represent hydrogen or a methyl group, $R_{10}$ represents an alkyl group with 1 to 12 carbon atoms, and n represents an integer of 1 to 23, or hydroxyalkyl acrylate or methacrylate.

16. The photosensitive composition as claimed in claim 15, wherein the acrylic or methacrylic ester is methyl acrylate or methacrylate, ethyl acrylate or methacrylate, propyl acrylate or methacrylate, n-butyl acrylate or methacrylate, isobutyl acrylate or methacrylate, tert-butyl acrylate or methacrylate, n-pentyl acrylate or methacrylate, n-hexyl acrylate or methacrylate, 2-ethylhexyl acrylate or methacrylate, n-octyl acrylate or methacrylate, n-decyl acrylate or methacrylate, lauryl acrylate or methacrylate, or n-octadecyl acrylate or methacrylate; the diester of a dicarboxylic acid is dimethyl maleate, diethyl maleate, dibutyl maleate, dioctyl maleate, dimethyl fumarate, diethyl fumarate, dibutyl fumarate, dioctyl fumarate, dimethyl itaconate, diethyl itaconate, dibutyl itaconate or dioctyl itaconate; the acrylate or methacrylate having a cyclic side chain is benzyl acrylate or methacrylate, cyclohexyl acrylate or methacrylate, tetrahydrofurfuryl acrylate or methacrylate, or glycidyl acrylate or methacrylate; the alkoxyalkyl acrylate or methacrylate or alkoxypolyalkyleneglycol acrylate or methacrylate is methoxyethyl acrylate or methacrylate, ethoxyethyl acrylate or methacrylate, propoxyethyl acrylate or methacrylate, butoxyethyl acrylate or methacrylate, methoxy-i-propyl acrylate or methacrylate, ethoxy-i-propyl acrylate or methacrylate, propoxy-i-propyl acrylate or methacrylate, butoxy-i-propyl acrylate or methacrylate, methoxydiethyleneglycol acrylate or methacrylate, ethoxydiethyleneglycol acrylate or methacrylate, propoxydiethyleneglycol acrylate or methacrylate, butoxydiethyleneglycol acrylate or methacrylate, methoxydipropyleneglycol acrylate or methacrylate, ethoxydipropyleneglycol acrylate or methacrylate, propoxydipropyleneglycol acrylate or methacrylate, butoxydipropyleneglycol acrylate or methacrylate, methoxytetraethyleneglycol acrylate or methacrylate, methoxynonaethyleneglycol acrylate or methacrylate, methoxytetrapropyleneglycol acrylate or methacrylate, or methoxynonapropyleneglycol acrylate or methacrylate; and the hydroxyalkyl acrylate or methacrylate is 2-hydroxyethyl acrylate or methacrylate, or 2-hydroxypropyl acrylate or methacrylate.

17. The photosensitive composition as claimed in claim 2, wherein the photosensitizer is an $\alpha$-diketone compound, an acyloin, an acyloin ether, a polynuclear quinone, a peroxide or an azo compound.

18. The photosensitive composition as claimed in claim 17, wherein the photosensitizer is diacetyl, benzil, benzoin, pivaloin, benzoin methyl ether, benzoin ethyl ether, benzoin isopropyl ether, anthraquinone, 1,4-naphthoquinone, benzoyl peroxide, methyl ethyl ketoneperoxide, or 2,2'-azobisisobutyronitrile.

19. The photosensitive composition as claimed in claim 1, wherein the photosensitive crosslinking agent is diazidochalcone, 4,4'-diazidostilbene, 4,4'-diazidostilbene-2,2'-disulfonic acid or 2,6-bis-(p-azidobenzal) cyclohexanone.

20. The photosensitive composition as claimed in claim 2, wherein the amount of the photosensitizer added is 0.1 to 10 weight % based on the weight of the copolymer (I).

21. The photosensitive composition as claimed in claim 20, wherein the amount of the photosensitizer added is 1 to 5 weight % based on the weight of the copolymer (I).

22. The photosensitive composition as claimed in claim 1, wherein the amount of the photosensitive crosslinking agent is 0.1 to 10 weight % based on the weight of the copolymer (I).

23. The photosensitive composition as claimed in claim 1, wherein the amount of the photosensitive crosslinking agent is 1 to 5 weight % based on the weight of the copolymer (I).

24. The photosensitive composition as claimed in claim 2, wherein the photopolymerizable unsaturated monomer (III) is an unsaturated aromatic compound, an unsaturated nitrile compound, an alkyl acrylate or methacrylate, a hydroxyalkyl acrylate or methacrylate, an acrylate or methacrylate having a cyclic side chain, an $\alpha,\beta$-ethylenically unsaturated carboxylic acid, a monoester of an unsaturated polycarboxylic acid, a diester of an unsaturated polycarboxylic acid, acrylamide, methacrylamide, ethyleneglycol diacrylate or dimethacrylate, a polyalkylene glycol diacrylate or dimethacrylate, a diacrylate, triacrylate, tetraacrylate, dimethacrylate, trimethacrylate or tetramethacrylate of polyhydric alcohol, oligoacrylate or oligomethacrylate represented by the formula,

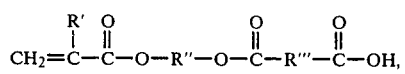

-continued

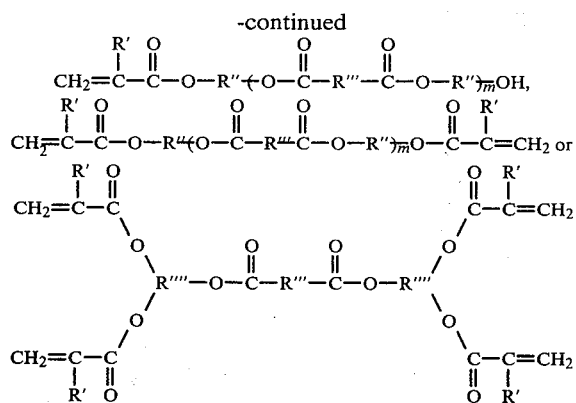

wherein R' is hydrogen or methyl; R" is a $C_{2-10}$ glycol residue; R'" is a $C_{4-8}$ dicarboxylic acid residue; R"" is a $C_{3-5}$ triol residue; and m is an integer of 1 to 10, diallylidenepentaerythritol, 2,2'-bis(4-methacryloxydiethoxyphenyl)propane, 2,2'-bis(4-acryloxydiethoxyphenyl)-propane, or 2,2'-bis(4-acryloxypropyloxyphenyl)propane.

25. The photosensitive composition as claimed in claim 24, wherein the photopolymerizable unsaturated monomer is styrene, α-methylstyrene, o-methylstyrene, m-methylstyrene, p-methylstyrene, p-methoxystyrene, diisopropylenylbenzene, divinylbenzene, acrylonitrile, methacrylonitrile, methyl acrylate or methacrylate, ethyl acrylate or methacrylate, propyl acrylate or methacrylate, n-butyl acrylate or methacrylate, isobutyl acrylate or methacrylate, tert-butyl acrylate or methacrylate, n-pentyl acrylate or methacrylate, n-hexyl acrylate or methacrylate, 2-ethylhexyl acrylate or methacrylate, n-octyl acrylate or methacrylate, n-decyl acrylate or methacrylate, lauryl acrylate or methacrylate, n-octadecyl acrylate or methacrylate, 2-hydroxyethyl acrylate or methacrylate, 2-hydroxypropyl acrylate or methacrylate, benzyl acrylate or methacrylate, cyclohexyl acrylate or methacrylate, tetrahydrofurfuryl acrylate or methacrylate, maleic acid, fumaric acid, maleic anhydride, acrylic acid, methacrylic acid, itaconic acid, itaconic anhydride, monoethyl maleate, monoethyl fumarate, monoethyl itaconate, dimethyl maleate, diethyl maleate, dibutyl maleate, dioctyl maleate, dimethyl fumarate, diethyl fumarate, dibutyl fumarate, dioctyl fumarate, dimethyl itaconate, diethyl itaconate, dibutyl itaconate, dioctyl itaconate, acrylamide, methacrylamide, N,N'-methylenebisacrylamide, N,N'-hexamethylenebisacrylamide, ethyleneglycol diacrylate or dimethacrylate, polyalkyleneglycol diacrylate or dimethacrylate (2 to 23 alkyleneglycol units), diacrylate, triacrylate, tetraacrylate, dimethacrylate, trimethacrylate or tetramethacrylate of glycerin, pentaerythritol, trimethylolalkane or tetramethylolalkane (alkane is methane, ethane or propane), diallylidenepentaerythritol, 2,2'-bis(4-methacryloxydiethoxyphenyl)propane, 2,2'-bis(4-acryloxydiethoxyphenyl)propane, 2,2'-bis(4-acryloxypropyloxyphenyl)propane, monoacryloxyethyl maleate, monomethacryloxyethyl maleate, monoacryloyloxyisopropyl maleate, monomethacryloyloxyisopropyl maleate, monoacryloyloxyethyl succinate, monoacryloyloxyethyl phthalate, monoacryloyloxyethyl tetrahydrophthalate, monoacryloyloxyethyl hexahydrophthalate, monoacrylate or monomethacrylate of polyesterdiol of phthalic acid with ethyleneglycol, monoacrylate or monomethacrylate of polyesterdiol of phthalic acid with propyleneglycol, monoacrylate or monomethacrylate of polyesterdiol of hexahydrophthalic acid with ethyleneglycol, monoacrylate or monomethacrylate of polyesterdiol of hexahydrophthalic acid with propyleneglycol, ester of 2-hydroxyethyl acrylate with phthalic anhydride (2:1 molar ratio), ester of 2-hydroxyethyl methacrylate with phthalic anhydride (2:1 molar ratio), or polyesteracrylate consisting of adipic acid, glycerine and acrylic acid (0.5/½ molar ratio).

26. The photosensitive composition as claimed in claim 2, wherein the photopolymerizable unsaturated monomer is present in an amount of 5 to 200 weight % based on the weight of the copolymer (I).

27. The photosensitive composition as claimed in claim 26 wherein the photopolymerizable unsaturated monomer is present in an amount of 10 to 100 weight % based on the weight of the copolymer (I).

28. The photosensitive composition as claimed in claim 2, wherein a part of the photopolymerizable unsaturated monomer component is constituted by an alkoxyalkyl acrylate or methacrylate or alkoxypolyalkyleneglycol acrylate or methacrylate represented by the following formula:

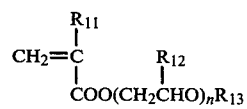

where $R_{11}$ and $R_{12}$ represent hydrogen or a methyl group, $R_{13}$ represents an alkyl group with 1 to 12 carbon atoms, and n represents an integer of 1 to 23.

29. The photosensitive composition as claimed in claim 28, wherein the alkoxyalkyl acrylate or methacrylate, or alkoxypolyalkyleneglycol acrylate or methacrylate is methoxyethyl acrylate or methacrylate, ethoxyethyl acrylate or methacrylate, propoxyethyl acrylate or methacrylate, butoxyethyl acrylate or methacrylate, methoxy-i-propyl acrylate or methacrylate, ethoxy-i-propyl acrylate or methacrylate, propoxy-i-propyl acrylate or methacrylate, butoxy-i-propyl acrylate or methacrylate, methoxydiethyleneglycol acrylate or methacrylate, ethoxydiethyleneglycol acrylate or methacrylate, propoxydiethyleneglycol acrylate or methacrylate, butoxydiethyleneglycol acrylate or methacrylate, methoxydipropyleneglycol acrylate or methacrylate, ethoxydipropyleneglycol acrylate or methacrylate, propoxydipropyleneglycol acrylate or methacrylate, butoxydipropyleneglycol acrylate or methacrylate, methoxytetraethyleneglycol acrylate or methacrylate, methoxynonaethyleneglycol acrylate or methacrylate, methoxytetrapropyleneglycol acrylate or methacrylate, or methoxynonapropyleneglycol acrylate or methacrylate.

30. The photosensitive composition as claimed in claim 28, wherein the amount of the photopolymerizable unsaturated monomer added is 5 to 200 weight % based on the weight of the copolymer (I) and the amount of alkoxyalkyl acrylate or methacrylate or alkoxypolyalkyleneglycol acrylate or methacrylate is 5 to 95 weight % based on the weight of the photopolymerizable unsaturated monomer.

31. The photosensitive composition as claimed in claim 30, wherein the amount of the photopolymerizable unsaturated monomer added is 5 to 200 weight % based on the weight of the copolymer (I) and the amount of alkoxyalkyl acrylate or methacrylate or alkoxypolyalkyleneglycol acrylate or methacrylate is 10 to 80 weight % based on the weight of the photopolymerizable unsaturated monomer.

32. The photosensitive composition as claimed in claim 30, wherein the amount of the photopolymerizable unsaturated monomer is 10 to 100 weight % based on the weight of the copolymer (I).

33. The photosensitive composition as claimed in claim 2, including a storage stabilizer as an additional component.

34. The photosensitive composition as claimed in claim 33, wherein the storage stabilizer is nitrosophenylhydroxylamine, a metal salt of dithiocarbamic acid, or thiuram.

35. The photosensitive composition as claimed in claim 34, wherein the storage stabilizer is aluminum-N-nitrosophenylhydroxylamine, ammonium-N-nitrosophenylhydroxylamine, zinc dimethyldithiocarbamate, zinc diethyldithiocarbamate, zinc dipropyldithiocarbamate, zinc dibutyldithiocarbamate, nickel dibutyldithiocarbamate, tellurium diethyldithiocarbamate, tetramethylthiuram monosulfide, or tetramethylthiuram disulfide.

36. The photosensitive composition as claimed in claim 33, wherein the amount of the storage stabilizer added is 0.01 to 2 weight % based on the weight of the copolymer (I).

37. The photosensitive composition as claimed in claim 3, wherein the $\alpha,\beta$-ethylenically unsaturated carboxylic acid or anhydride in the copolymer (I) has been reacted with an inorganic alkali, an alkali salt or an amine compound in a proportion of 0.05 to 1.0 equivalent per equivalent of the carboxyl group.

38. The photosensitive composition as claimed in claim 1, wherein the conjugated diolefinic hydrocarbon (A) is a compound represented by the formula,

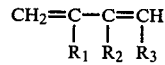

wherein $R_1$ is hydrogen, methyl, ethyl, n-propyl, isopropyl, phenyl, Cl, Br, or I; $R_2$ is hydrogen, methyl or Cl; and $R_3$ is hydrogen or methyl.

39. The photosensitive composition as claimed in claim 2, wherein the $\alpha,\beta$-ethylenically unsaturated carboxylic acid or anhydride (B) is a monocarboxylic acid represented by the formula,

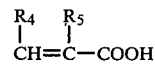

wherein $R_4$ is hydrogen or methyl and $R_5$ is hydrogen, methyl, ethyl or Cl; a dicarboxylic acid having 4 to 5 carbon atoms; an anhydride thereof, or a monoester of a dicarboxylic acid.

40. The photosensitive composition as claimed in claim 1, wherein the monoolefinically unsaturated compound (C) is styrene, $\alpha$-methylstyrene, o-methylstyrene, m-methylstyrene, p-methylstyrene, p-methoxystyrene, acrylonitrile, methacrylonitrile, vinyl chloride, vinylidene chloride, acrylamide, methacrylamide, vinyl acetate, an acrylic or methacrylic ester expressed by the following formula:

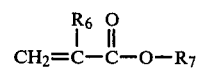

wherein $R_6$ represents hydrogen or methyl and $R_7$ represents an alkyl group having 1 to 18 carbon atoms, a diester of a dicarboxylic acid, an acrylate or methacrylate having a cyclic side chain, an alkoxyalkyl acrylate or methacrylate or alkoxy polyalkyleneglycol acrylate or methacrylate represented by the following formula:

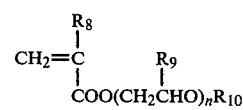

wherein $R_8$ and $R_9$ represent hydrogen or methyl, $R_{10}$ represents an alkyl group having 1 to 12 carbon atoms, and n represents an integer of 1 to 23, or a hydroxyalkyl acrylate or methacrylate.

41. The photosensitive composition of claim 1 or 2 wherein said copolymer (I) further comprises from 14 to 85 mol % of said monoolefinically unsaturated compound (C).

42. A photosensitive resin plate, comprising the photosensitive composition of claim 1 on a support.

43. A photosensitive resin plate useful in the production of a flexographic printing plate, comprising:
the photosensitive resin composition of claim 2 on a support.

44. The photosensitive resin plate of claim 43, wherein said support is manufactured from a flexible material.

* * * * *